United States Patent [19]

Barouch et al.

[11] Patent Number: 5,121,335
[45] Date of Patent: Jun. 9, 1992

[54] METHOD AND APPARATUS FOR VERIFYING MICROCIRCUIT FABRICATION PROCEDURE

[75] Inventors: Bennett J. Barouch, Santee; Scott R. Powell, Carlsbad, both of Calif.

[73] Assignee: Hughes Aircraft Company, Los Angeles, Calif.

[21] Appl. No.: 477,690

[22] Filed: Feb. 9, 1990

[51] Int. Cl.$^5$ .............................................. G06F 15/20
[52] U.S. Cl. .................................... 364/488; 364/490
[58] Field of Search ............... 364/488, 490; 371/67.1; 382/8

[56] References Cited

U.S. PATENT DOCUMENTS

| | | | |
|---|---|---|---|
| 4,766,516 | 8/1988 | Ozdemir et al. | 361/380 |
| 4,984,282 | 1/1991 | Manns et al. | 382/8 |
| 4,985,927 | 1/1991 | Norwood et al. | 382/8 |

*Primary Examiner*—Parshotam S. Lall
*Assistant Examiner*—Edward Cosimano

*Attorney, Agent, or Firm*—V. D. Duraiswamy; W. K. Denson-Low

[57] ABSTRACT

An apparatus is used to perform a fabrication procedure on a microcircuit under control of specification data. In a preferred embodiment of the invention, the procedure includes making relatively undetectable modifications to the microcircuit using a focussed ion beam to deter unauthorized reproduction and/or use of the microcircuit. The output of the apparatus is tapped during the procedure to generate record data of the signals actually applied to control the focussed ion beam to perform the procedure. The record data is written into at least one verification data storage area of the microcircuit, preferably using the focussed ion beam. During testing of the microcircuit, the generated data which was written into the storage area is read out and compared with the specification data. Proper performance of the procedure is verified if the specification data and record data correspond to each other.

29 Claims, 4 Drawing Sheets

METHOD AND APPARATUS FOR VERIFYING MICROCIRCUIT FABRICATION PROCEDURE

BACKGROUND OF THE INVENTION

1. Field of the Invention

The present invention generally relates to the fabrication of electronic microcircuits, and more specifically to a method and apparatus for validating proper performance of a microcircuit fabrication procedure.

2. Description of the Related Art

A method for protecting hardware integrated circuits or microcircuits against unauthorized copying and/or use is described in U.S. Pat. No. 4,766,516, entitled "Method and Apparatus for Securing Integrated Circuits from Unauthorized Copying and Use", issued Aug. 23, 1988, to F. Ozdemir et al, and assigned to Hughes Aircraft Company, the assignee of the present invention. According to this technique, at least one additional circuit element that does not contribute towards the function of an integrated circuit (IC), but rather inhibits the proper functioning of the IC in case of an attempted copying, analysis, or other unauthorized use, is fabricated along with the overall IC. The identities of the additional circuit elements are disguised by forming them with the visible appearance of apparent elements, but with physical modifications that are not readily visible to a copyist but cause them to function in a different manner. Such modifications include very narrow open circuit cuts in metallized connection lines, preferably made with a focused ion beam (FIB) or laser beam; disordering the lattice structure or changing the doping level of a semiconductor region, preferably with a FIB; and injecting electrical charge into a semiconductor region, preferably with an electron beam.

The FIB and other types of modifications are relatively undetectable, which is desirable for the intended purpose of deterring unauthorized copying and/or use. However, the undetectability of the modifications also makes it difficult to determine if the modification procedure was performed properly. A malfunction in the apparatus or controlling software, as well as unauthorized alteration or use thereof, could render the modifications or the circuit itself inoperative or different from what was intended.

In addition to security applications, FIBs, for example, are used in a wide variety of microcircuit fabrication processes, an example being presented in an article entitled "Lithographic approach for 100 nm fabrication by focussed ion beam", by S. Matsui et al, Journal of Vacuum Science Technology, B4(4), pp. 845-849 (Jul/Aug 1986). Erroneous performance of an FIB processing procedure will produce defective microcircuits, with the source of the error being difficult to determine due to the relative undetectability of the FIB modifications.

SUMMARY OF THE INVENTION

The present invention provides a method and apparatus for performing and verifying a fabrication procedure on a microcircuit or integrated circuit chip, which is especially valuable where the procedure involves making modifications to the microcircuit which are relatively undetectable, including modifications using a FIB, laser beam, or electron beam, as described in the above referenced patent to Ozdemir et al. However, the invention is broadly applicable to any microcircuit fabrication procedure where verification of proper performance of the procedure is desired, and control or output signals from the apparatus performing the procedure can be tapped and used to generate a record of the procedure. In addition to providing protection against unauthorized tampering, the invention provides an effective method of quality control which is valuable per se in applications where protection against tampering is not required.

More specifically, an apparatus is used to perform a fabrication procedure on a microcircuit under control of specification data. In a preferred embodiment of the invention, the procedure includes making relatively undetectable modifications to the microcircuit using a focussed ion beam or other means to deter unauthorized analysis, reproduction and/or use of the microcircuit. The output of the apparatus is tapped to generate record data of the signals actually applied to control the focussed ion beam or other devices to perform the procedure. The record data is written into at least one verification data storage area of the microcircuit, preferably using the same devices. During testing of the microcircuit, the data written into the storage area is read out, and compared with the specification data and generated record data. Proper performance of the procedure is verified if the compared data correspond to each other.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1A:
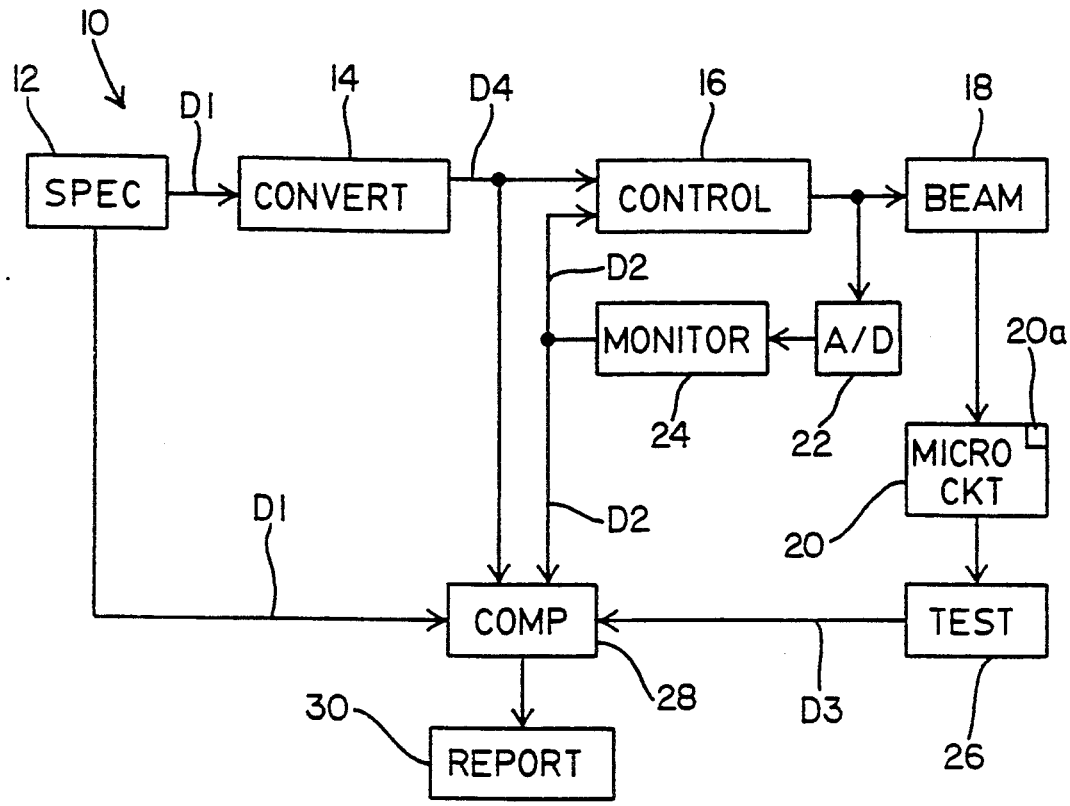
FIG. 1a is a block diagram illustrating an apparatus for performing and verifying a microcircuit fabrication procedure according to the present invention.

Referring now to FIG. 1a of the drawing, an apparatus for performing and verifying a microcircuit fabrication procedure is generally designated as 10, and includes a specification unit 12. Although not shown in detail, the unit 12 generally stores specification data in the form of computer readable data which specifies the procedure to be performed on the microcircuit, and a computer for running the software. The specification data will generally be in a high level language in which the procedure steps are specified in user-friendly form.

The specification data is designated as D1, and fed from the specification unit 12 to a conversion unit 14, which converts or translates the high level specification data D1 to low level control data D4 in the form of numerical codes. In one embodiment of the invention the conversion unit 14 is implemented as software. In another embodiment of the invention the conversion unit 14 is implemented as hardware. The control data is applied to a control unit 16, which is connected to control the operation of an apparatus 18 for performing the desired procedure on a microcircuit. In a preferred embodiment of the invention, the apparatus 18 is constructed to generate a focussed electron beam (FIB), laser beam, electron beam, and/or other means for performing a relatively undetectable circuit modification (RUCM) procedure such as described in the patent to Ozdemir et al under control of the specification/control data D1, D4. However, the invention is not so limited, and the apparatus, in another embodiment of the invention, is constructed to perform any other microcircuit fabrication procedure which is capable of generating a record of the process steps actually performed, such as photolithography, epitaxial layer deposition, etc.

In a preferred embodiment of the invention in which the apparatus 18 is embodied as an FIB device, the control data D4 includes numerical codes designating movement of the FIB to a specified set of rectangular coordinates, select a type of ion to be implanted, perform irradiation of the microcircuit at the specified coordinates for a specified length of time at a prescribed energy level and dosage, etc. It will be noted that the scope of the invention further includes providing the specification data in the low level control format D4, in which case the conversion unit 14 is not required.

In a preferred embodiment of the invention, the control unit 16 includes a pattern generator (not shown), for generating analog or other applicable control signals which are applied to the apparatus 18 to position the FIB. The apparatus 18 radiates the FIB onto a microcircuit 20 to perform the procedure specified by the specification data D1. In a preferred embodiment of the invention, the microcircuit 20 is a single integrated circuit chip, a wafer on which a plurality of integrated circuit chips or dies are formed, or any other type of microelectronic element which is capable of being operated on by the specified procedure.

Where the control signals applied from the control unit 16 to the FIB apparatus 18 are analog, an analog-todigital converter 22 is provided to convert the signals to digital form prior to operation thereon by a monitor unit 24, which produces record data D2 constituting a record or log of the procedure actually performed by the FIB apparatus 18 on the microcircuit 20. In one embodiment of the invention, the monitor unit 24 is implemented by software. In another embodiment of the invention, the monitor unit 24 is implemented by hardware. In one embodiment of the invention, the monitor unit 24 generates the record data D2 in compressed form. In another embodiment of the invention, the monitor unit 24 generates the record data D2 in uncompressed form. More specifically, in a preferred embodiment of the invention, the record data constitutes a complete reconstruction of the activity of the apparatus 18. Assuming that the procedure was performed properly in accordance with the specification data D1, the record data D2 will correspond exactly with the control data D4. Where a complete record of the FIB activity is not required, the monitor unit 24, in accordance with a preferred embodiment of the invention, is constructed to to generate the record data D2 as including a record of only part of the FIB activity, such as every 5th or 10th operation, or only the coordinates and ion type for each step.

In accordance with the present invention, the monitor unit 24 applies the record data D2 to the control unit 16, which then controls the apparatus 18 to use the FIB to write the data D2 into a verification data storage area 20a on the microcircuit 20. As will be described in detail below, in one embodiment of the invention, the storage area 20a includes a read-only memory (ROM) provided on the microcircuit 20. In another embodiment of the invention, the storage 20a is spatially distributed on the microcircuit 20. In a preferred embodiment of the invention, the apparatus 18 writes the record data D2 into the storage area 20a by cutting circuit metallizations or the like using the techniques disclosed in the patent to Ozdemir et al, or any other method for permanently writing the data in the storage area 20a.

After the procedure has been performed, and the data D2 which constitutes a record of the procedure has been written in the storage area 20a, a test unit 26 is used to perform a desired test procedure on the microcircuit 20 to verify that the microcircuit 20 functions properly. In addition, the test unit 26 reads out the data which was written into the storage area 20a, and applies this data, designated as D3, to a comparator unit 28. The data D1 is applied from the specification unit 12 to the comparator unit 28, as well as the record data D2 from the monitor unit 24. In another embodiment of the invention, the control data D4 is be applied from the conversion unit 14 to the comparator unit 28.

The comparator 28 compares the data D3 read from the storage area 20a of the microcircuit 20 with at least one of the data D1, D2, and D4. In one embodiment of the invention, the comparator 28 is implemented by software. In another embodiment of the invention, the comparator 28 is implemented by hardware. In either embodiment, the comparator 28 includes conversion or translation means for converting data between the various formats of D1, D2, D3 and D4 as required. The comparator 28 may be connected to a report unit 30, for generating a written or visual report of the results of the operation of the apparatus 10.

The comparator 28 produces a verification that the procedure has been performed properly if the compared data correspond to each other. In a preferred embodiment of the invention, the comparator 28 is adapted to produce the verification only if the functional test of the operation of the microcircuit 20 performed by the test unit 26 is successful, in addition to the compared data corresponding to each other.

Correspondence between all of the data D1, D2, D3 and D4 verifies that the specified procedure was performed properly. Where some of the data correspond and others do not, comparison of the various data enables determination of the point in the process in which deviation from the specified procedure occurred.

Non-correspondence between the data D1 and D4 indicates malfunction of or tampering with the conversion unit 14. A discrepancy between the data D4 and D2 indicates erroneous operation of the control unit 16. A discrepancy between the data D2 and D3 will result from a malfunction of the apparatus 18, or a defect in or damage to the microcircuit 20 prior to testing. Discrepancy between the data D2 and D3 will also result from malfunctioning of the test unit 26. Failure of the microcircuit 20 to function properly under test will result from defective or compromised specification data D1, in a case where the procedure includes RUCMs which must be performed properly in order to convert the microcircuit 20 from non-functional to functional form.

Where security is a consideration, the verification data storage area 20a will be destroyed after testing has been completed, for example by application of excessive voltage, and removed from the microcircuit 20 during a subsequent wafer scribing or other process step as illustrated in FIG. 16.

As further illustrated in FIG. 1a, the output of the monitor unit 24 is connected to an input of the control unit 16. This enables the monitor unit 24 to apply predetermined control data to the control unit 16 to cause the apparatus 18 to perform a corresponding procedure. In one embodiment of the invention, the predetermined data is constituted by the record data. In another embodiment of the invention, the predetermined data is constituted by a set of special test data stored in the monitor unit 24. In either case, the monitor unit 24 is adapted to compare signals generated by the control unit 16 under control of the predetermined data, with the predetermined data itself (after format conversion). Proper operation of the control unit 16 and apparatus 18 will result in correspondence between the compared data, and vice-versa. This arrangement enables the controller 16 to be tested independently of the other units of the apparatus 10. In a preferred embodiment of the invention, the apparatus 18 is turned off, and this test performed without a microcircuit present, for purposes of economy.

In an alternative embodiment of the invention, the monitor unit 24 is adapted to write other data in addition to the record data into the verification storage area 20a on the microcircuit 20. For example, a wafer batch number, a test procedure for the microcircuit 20, or any other information desired for quality control or security purposes is written into the storage area 20a.

Figure 2:
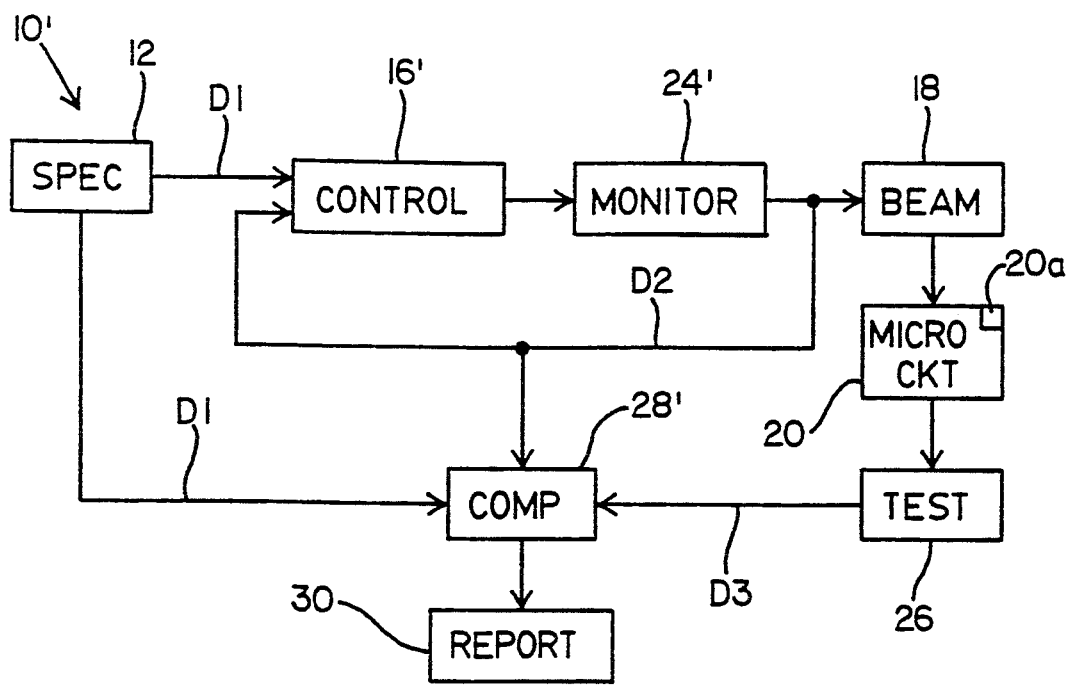
FIG. 2 is similar to FIG. 1a, but illustrates a second embodiment of the invention.
Figure 1B:
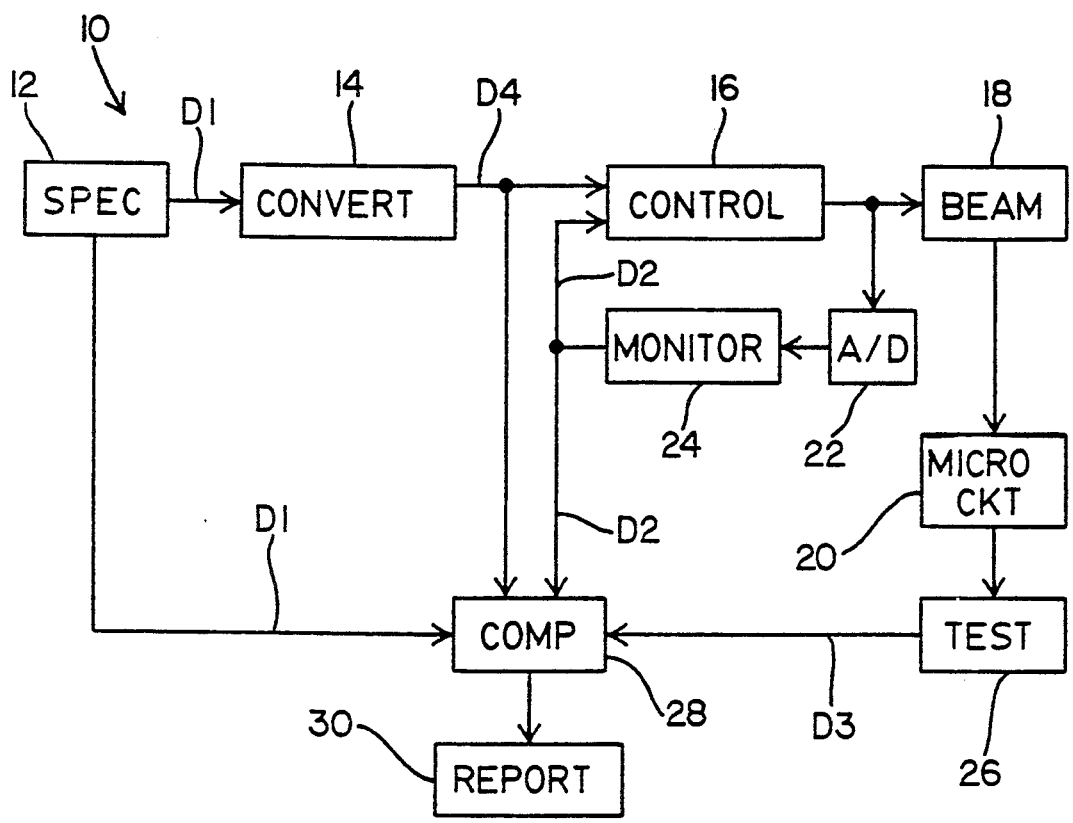
FIG. 1b illustrates the apparatus of FIG. 1a after destruction of a verification data storage area thereof.

An apparatus 10' illustrated in FIG. 2 is similar to the apparatus 10 of FIG. 1a, with like elements designated by the same reference numerals, and corresponding but modified elements designated by the same reference numerals primed. The apparatus 10' differs from the apparatus 10, in that a monitor unit 24' is provided in a series configuration between a control unit 16' and the apparatus 18. This arrangement offers increased security, where such is desired. As a further modification, the conversion unit 14 is omitted, and the specification data D1 applied directly to the control unit 16'. In one embodiment of the invention, the control unit 16' is adapted to incorporate the function of the conversion unit 14. In another embodiment of the invention, the specification data D1 is provided in a form which does not require conversion. The control unit 28' differs from the control unit 28 in that it does not receive the data D4.

Figure 3:
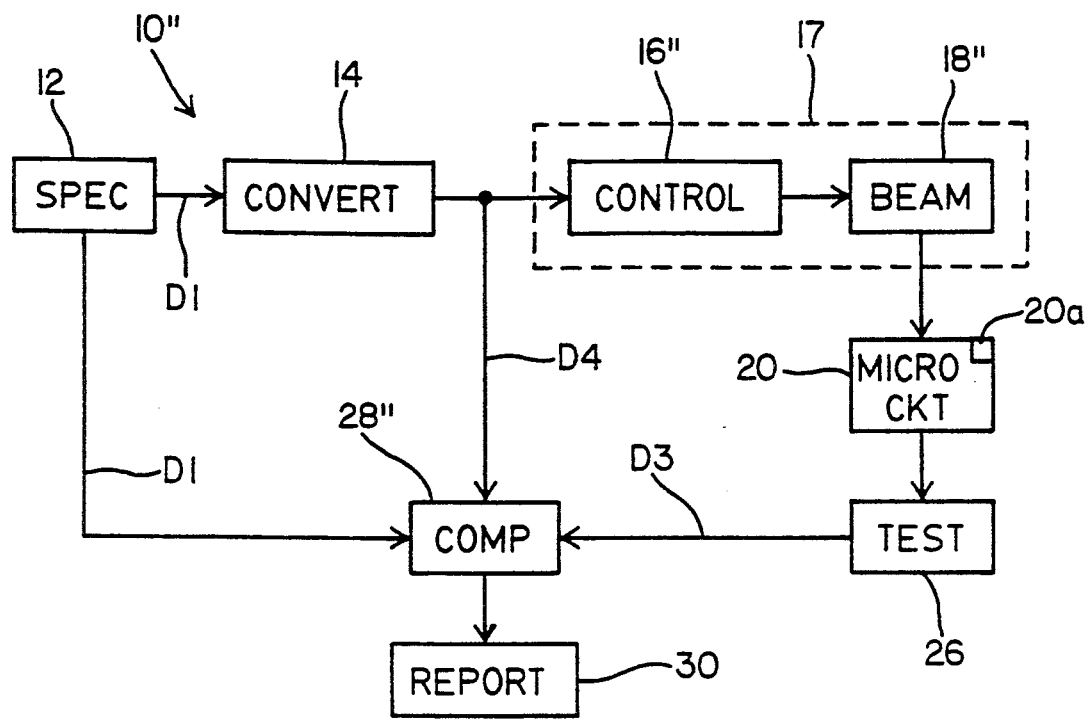
FIG. 3 is also similar to FIG. 1a, but illustrates a third embodiment of the invention.

An apparatus 10" illustrated in FIG. 3 is also similar to the apparatus 10 of FIG. 1a, with like elements designated by the same reference numerals, and corresponding but modified elements designated by the same reference numerals double primed. In the apparatus 10", the control unit 16" and apparatus 18" are integrated into a unit 17 in such a manner that it is impractical to tap the output of the control unit 16" to obtain control signals therefrom. In this case, a comparator 28" is adapted to perform the recording functions of the monitor units 24 and 24' of the previously described embodiments, with the control data D4 being used to generate the record data. Although the apparatus 10" is a less preferred embodiment of the invention in that it does not provide a direct record of the actual activity of the apparatus 18", it is still useful since it enables comparison of the results of the activity with the input specification.

Figure 4:
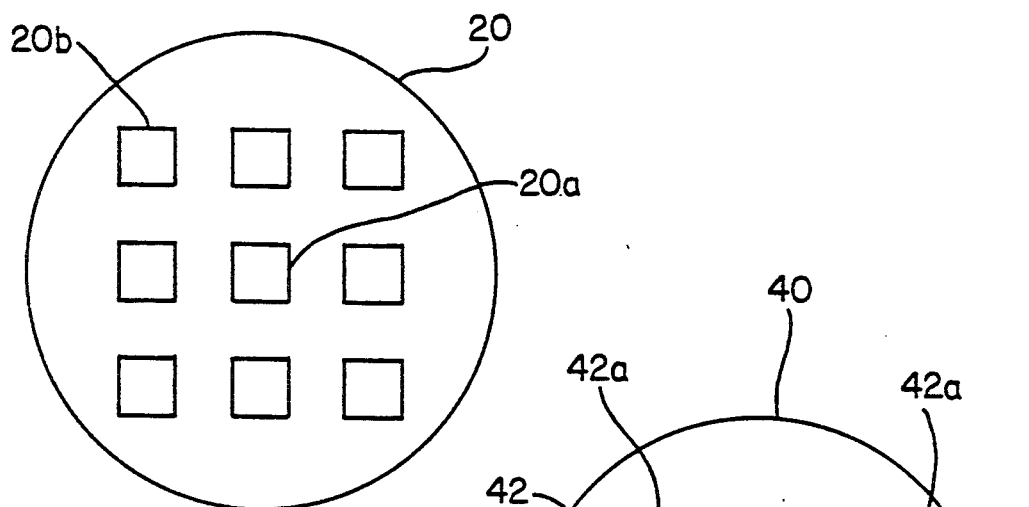
FIGS. 4 to 7 are diagrams illustrating alternative arrangements of verification data storage areas on microcircuits in accordance with the invention.

In a preferred embodiment of the invention, the verification data storage area 20 is formed as a ROM which is centrally located on the microcircuit 20 as illustrated in FIG. 4. As viewed in the drawing, the microcircuit 20 is in the form of a semiconductor wafer, with a plurality of integrated circuit chips or dies 20b fabricated on the wafer 20 in addition to the ROM 20a. This arrangement is especially advantageous in that fabrication defects are generally minimum at the center of a wafer.

Figure 5:
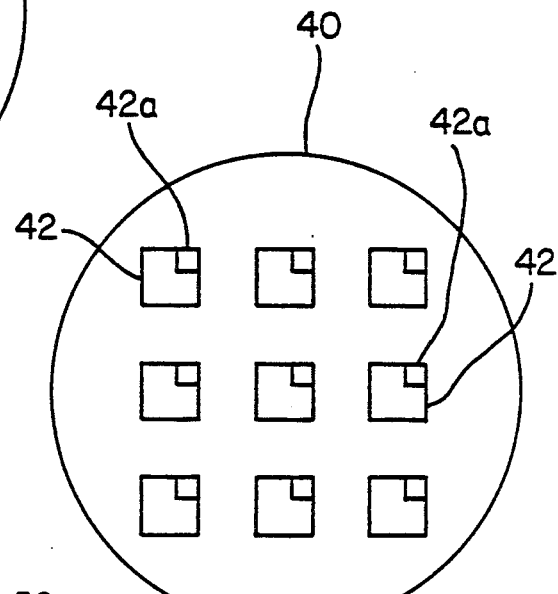

FIG. 5 illustrates another microcircuit 40 which is applicable for practicing the present invention, in the form of a wafer on which are fabricated a plurality of integrated circuit chips or dies 42. The verification data storage area is in the form of a separate storage area 42a provided on each chip 42. In one embodiment of the invention, the record data for the entire wafer 40 is duplicately written into each area 42a. In another embodiment of the invention, only the record data pertinent to the individual chip 42 is written in the respective storage area 42a.

Figure 6:
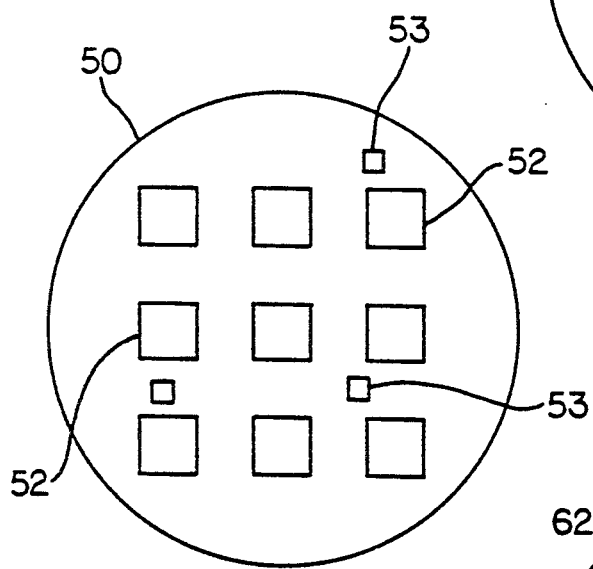

Another microcircuit 50 applicable to the present invention is illustrated in FIG. 6, in the form of a wafer having a plurality of integrated circuits 52 formed thereon. The verification data storage area in this case includes a plurality of memory elements 53 which are unevenly distributed over the area of the wafer 50. In this embodiment, portions of the record data are distributed among the memory elements 53 respectively. The distribution of data enables an increased level of security.

Figure 7:
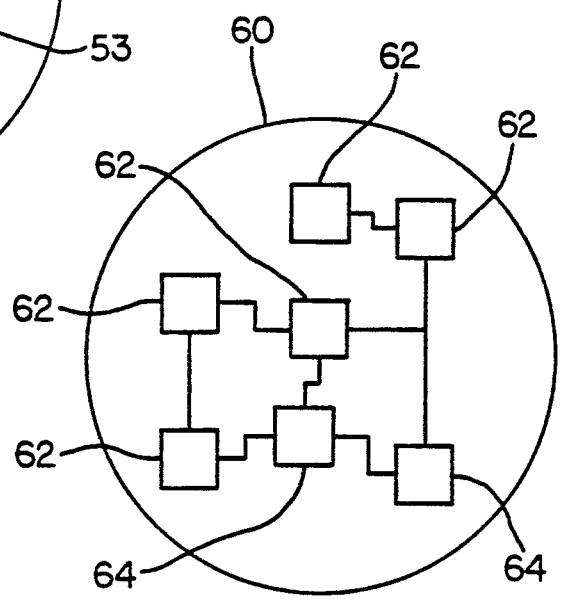

FIG. 7 illustrates another microcircuit 60 applicable to practicing the present invention, in the form of a single integrated circuit chip or die. A large number, typically thousands, of circuit components are formed on the integrated circuit 60. Most of the components, collectively designated as 62, are conventional circuit elements which make the integrated circuit 60 function in the desired manner. Storage elements 64, which are unevenly distributed in the integrated circuit 60 and preferably disguised as ordinary components using the techniques of Ozdemir et al, constitute the verification data storage area. The record data is written into the elements 64 either duplicately, or distributively, as desired.

Figure 8:
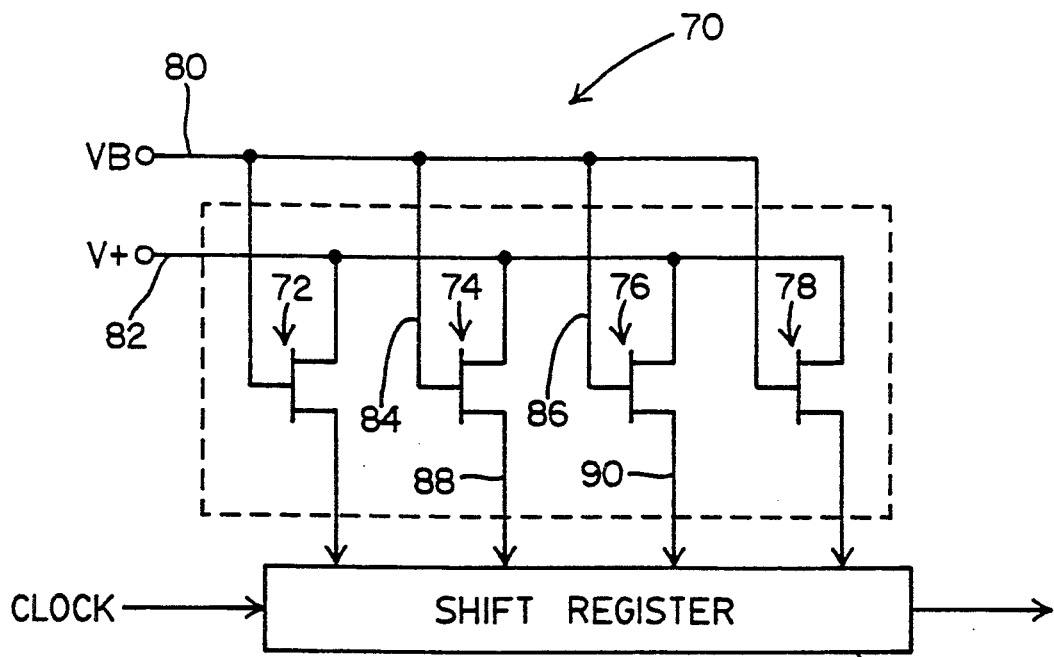
FIG. 8 is an electrical schematic diagram illustrating an exemplary unit cell of a verification data storage area.

In a preferred embodiment of the invention, a unit storage cell constitutes a basic element of any of the verification data storage areas shown in FIGS. 4 to 7 is illustrated in FIG. 8. The cell is generally designated as 70, and includes enhancement type field effect transistors (FETs) 72, 74, 76 and 78 having gates commonly biased with a voltage VB from a bias line 80. Transistor current is provided by a voltage V+ from a positive voltage line 82 to the source of each FET. The four FETs enable the storage of four bits of data, or equivalently, a single four bit word.

It is preferred that each of the FETs have the visual appearance of a functioning conductive device, but that some of them be rendered non-operational by techniques such as disclosed in the patent to Ozdemir et al. For example, the bias lines to the FETs 74 and 76 have narrow FIB cuts 84 and 86 which open the respective bias voltage supply lines and prevent the FETs 74 and 76 from conducting. Alternatively, doped regions forming the drains of the FETs 74 and 76 are altered with damaged areas 88 and 90 respectively which are not visibly perceptible, but keep the FETs 74 and 76 open-circuited. An equivalent result is provided by a hidden channel modification.

The drains of the FETs 72, 74, 76 and 78 are connected to parallel inputs of a parallel-to-serial shift register 92. In a preferred embodiment of the invention, the four bit binary word constituted by the logic states of the FETs is read out by applying clock pulses to the shift register 92, and feeding the signals appearing at the serial output of the shift register 92 to an appropriate signal processing section in the test unit 26.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method for performing and verifying a microcircuit fabrication procedure, comprising the steps of:
   (a) providing first data specifying the procedure;
   (b) using apparatus to perform the procedure on a microcircuit under control of the first data;
   (c) generating second data as a record of the procedure performed in step (b);
   (d) writing the second data into the microcircuit;
   (e) reading the second data from the microcircuit to produce third data; and
   (f) comparing the third data with at least one of the first and second data, and verifying that the procedure was performed properly if said compared data correspond to each other.

2. A method as in claim 1, further comprising the step, performed subsequent to step (d), of:
   (g) testing the microcircuit, and verifying that the procedure was performed properly if the results of the test are successful and the compared data correspond to each other.

3. A method as in claim 1, further comprising the step, performed subsequent to step (f), of:
   (g) destroying the second data in the microcircuit.

4. A method as in claim 1, in which the procedure comprises making relatively undetectable modifications to the microcircuit.

5. A method as in claim 4, in which step (b) comprises making the relatively undetectable modifications using a focussed ion beam.

6. A method as in claim 4, in which step (b) comprises making the relatively undetectable modifications using at least one of a laser beam and an electron beam.

7. A method as in claim 1, in which the procedure comprises making relatively undetectable modifications to the microcircuit;
   step (b) includes using an apparatus to make the relatively undetectable modifications; and
   step (d) includes using the apparatus to physically write the second data into the microcircuit.

8. A method as in claim 7, in which the apparatus used in steps (b) and (d) is constructed to make the relatively undetectable modifications and write the second data on the microcircuit using a focussed ion beam.

9. A method as in claim 7, in which step (c) includes generating the second data as a record of control signals produced by the apparatus during step (b).

10. A method as in claim 7, in which:
    step (b) further includes converting the first data into control signals, and applying the control signals to the apparatus to perform the procedure; and
    step (c) includes generating the second data as a record of the control signals.

11. An apparatus for performing and verifying a microcircuit fabrication procedure, comprising:
    specification means for providing first data specifying the procedure;
    an apparatus for performing the procedure on a microcircuit;
    control means for controlling the apparatus to perform the procedure on the microcircuit under control of the first data;
    monitoring means for generating second data as a record of the procedure performed by the apparatus;
    the control means further controlling the apparatus to write the second data into the microcircuit;
    testing means for reading the second data from the microcircuit to produce third data; and
    comparator means for comparing the third data with at least one of the first and second data, and verifying that the procedure was performed properly if said compared data correspond to each other.

12. An apparatus as in claim 11, in which the apparatus is constructed to perform the procedure by making relatively undetectable modifications to the microcircuit.

13. An apparatus as in claim 11, in which the apparatus comprises means for using a focussed ion beam to perform the procedure by making relatively undetectable modifications to the microcircuit.

14. An apparatus as in claim 11, in which the apparatus comprises means for using at least one of a laser beam and an electron beam to perform the procedure by making relatively undetectable modifications to the microcircuit.

15. An apparatus as in claim 11, in which the monitoring means is constructed to generate the second data as a record of control signals produced by the apparatus while performing the procedure.

16. An apparatus as in claim 11, further comprising conversion means for converting the first data into control signals, and applying the control signals to the control means for controlling the apparatus to perform the procedure;
    the monitoring means being constructed to generate the second data as a record of the control signals.

17. An apparatus as in claim 11, in which the testing means further comprises means for testing the microcircuit, the comparator means verifying that the procedure was performed properly if the results of the test are successful and the compared data correspond to each other.

18. An apparatus as in claim 11, in which the monitoring means further comprises means for applying predetermined data to the control means, generating fourth data as a record of a procedure performed by the apparatus under control of the predetermined data, comparing the fourth data with the predetermined data, and verifying that the control means and apparatus are operating properly if the fourth data corresponds to the predetermined data.

19. An apparatus as in claim 11, in which the monitoring means is connected in circuit between the control means and the apparatus.

20. An apparatus for performing and verifying a microcircuit fabrication procedure, comprising:
  a microcircuit having at least one verification data storage area thereon;
  specification means for providing first data specifying the procedure;
  an apparatus for performing the procedure on a microcircuit;
  control means for controlling the apparatus to perform the procedure on the microcircuit under control of the first data;
  monitoring means for generating second data as a record of the procedure performed by the apparatus;
  the control means further controlling the apparatus to write the second data into said at least one verification data storage area of the microcircuit;
  testing means for reading the second data from said at least one verification data storage area to produce third data; and
  comparator means for comparing the third data with at least one of the first and second data, and verifying that the procedure was performed properly if said compared data correspond to each other.

21. An apparatus as in claim 20, in which the apparatus is constructed to perform the procedure by making relatively undetectable modifications to the microcircuit.

22. An apparatus as in claim 20, in which the apparatus comprises means for using a focussed ion beam to perform the procedure by making relatively undetectable modifications to the microcircuit.

23. An apparatus as in claim 20, in which the apparatus comprises means for using at least one of a laser beam and an electron beam to perform the procedure by making relatively undetectable modifications to the microcircuit.

24. An apparatus as in claim 20, in which the monitoring means is constructed to generate the second data as a record of control signals produced by the apparatus while performing the procedure.

25. An apparatus as in claim 20, further comprising conversion means for converting the first data into control signals, and applying the control signals to the control means for controlling the apparatus to perform the procedure;
  the monitoring means being constructed to generate the second data as a record of the control signals.

26. An apparatus as in claim 20, in which the monitoring means further comprises means for applying predetermined data to the control means, generating fourth data as a record of a procedure performed by the apparatus under control of the predetermined data, comparing the fourth data with the predetermined data, and verifying that the control means and apparatus are operating properly if the fourth data corresponds to the predetermined data.

27. An apparatus as in claim 20, in which said at least one verification data storage area comprises a plurality of storage areas which are unevenly distributed on the microcircuit.

28. An apparatus as in claim 20, in which said at least one verification data storage area comprises a readonly memory in which the second data is permanently written by the apparatus.

29. An apparatus as in claim 28, in which the readonly memory is located in a central portion of the microcircuit.

* * * * *